(12) United States Patent
Sakong et al.

(10) Patent No.: US 10,892,298 B2
(45) Date of Patent: Jan. 12, 2021

(54) LIGHT EMITTING DIODE DISPLAY DEVICE WITH SEPARATION FILM AND PARTITION ALIGNING TO EACH OTHER

(71) Applicant: Samsung Electronics Co., Ltd., Suwon-si (KR)

(72) Inventors: Tan Sakong, Seoul (KR); Yong Il Kim, Seoul (KR); Jong Uk Seo, Hwaseong-si (KR); Ji Hye Yeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 63 days.

(21) Appl. No.: 16/205,454

(22) Filed: Nov. 30, 2018

(65) Prior Publication Data
US 2019/0312083 A1 Oct. 10, 2019

(30) Foreign Application Priority Data

Apr. 10, 2018 (KR) .................. 10-2018-0041491

(51) Int. Cl.
*H01L 27/15* (2006.01)
*H01L 33/50* (2010.01)

(52) U.S. Cl.
CPC .......... *H01L 27/156* (2013.01); *H01L 33/505* (2013.01)

(58) Field of Classification Search
CPC .................. H01L 27/156; H01L 33/505
See application file for complete search history.

(56) References Cited

U.S. PATENT DOCUMENTS 9,024,346 B2 5/2015 Akimoto et al.
9,159,874 B2 10/2015 Kim et al.
(Continued)

FOREIGN PATENT DOCUMENTS

JP 4822482 B2 12/2002
JP 2007-059418 A 3/2007
(Continued)

*Primary Examiner* — Allen L Parker
*Assistant Examiner* — Charles N Ausar-El
(74) *Attorney, Agent, or Firm* — Muir Patent Law, PLLC

(57) ABSTRACT

A light emitting diode display device is provided. The light emitting diode display device includes a first light emitting diode pixel including a first light emitting diode layer and a first color conversion material on the first light emitting diode layer, a second light emitting diode pixel including a second light emitting diode layer and a second color conversion material on the second light emitting diode layer, a separation film disposed between the first light emitting diode layer and the second light emitting diode layer and a partition disposed between the first color conversion material and the second color conversion material and including a partition material, wherein the first and second light emitting diode pixels are divided by the separation film and the partition, the partition is disposed on the separation film in alignment with the separation film such that the partition includes linear portions that extend in a first direction and the separation film includes linear portions that also extend in the first direction and vertically overlap the linear portions of the partition, and the partition material includes an insulating material different from silicon.

19 Claims, 19 Drawing Sheets

(56) References Cited

U.S. PATENT DOCUMENTS

| | | | |
|---|---|---|---|
| 9,905,543 B2* | 2/2018 | Yeon | H01L 25/0753 |
| 2015/0243854 A1 | 8/2015 | Inoue et al. | |
| 2016/0163749 A1* | 6/2016 | Yang | H01L 27/1463 |
| | | | 257/446 |
| 2017/0092820 A1 | 3/2017 | Kim et al. | |
| 2017/0250316 A1* | 8/2017 | Yeon | H01L 25/0753 |
| 2017/0294479 A1* | 10/2017 | Cha | H01L 25/0655 |
| 2018/0047780 A1* | 2/2018 | Yeon | H01L 27/156 |

FOREIGN PATENT DOCUMENTS

| | | |
|---|---|---|
| JP | 6140730 B2 | 5/2017 |
| KR | 10-1259122 B1 | 4/2013 |
| KR | 10-1291153 B1 | 7/2013 |
| KR | 10-1350159 B1 | 2/2014 |
| WO | 2012-091275 A1 | 7/2012 |
| WO | 2014-091539 A1 | 6/2014 |

* cited by examiner

LIGHT EMITTING DIODE DISPLAY DEVICE WITH SEPARATION FILM AND PARTITION ALIGNING TO EACH OTHER

This application claims priority under 35 U.S.C § 119 to Korean Patent Application No. 10-2018-0041491 filed on Apr. 10, 2018 in the Korean Intellectual Property Office, the disclosure of which is incorporated herein by reference in its entirety.

BACKGROUND

1. Field of the Inventive Concept

Example embodiments according to the present inventive concept relate to a light emitting diode display device.

2. Description of the Related Art

Recently, semiconductor devices have been miniaturized and have been improved in performance. Thus, small structural differences of the constituent elements included in the light emitting diode display device may have a significant influence on the performance of the light emitting diode display device.

For example, misalignment of constituent elements of layers stacked vertically may have a significant influence on the performance of the light emitting diode display device.

SUMMARY

Aspects of the present inventive concept according to exemplary embodiments provide a light emitting diode display device capable of improving the yield of a light emitting diode display device, by aligning a separation film in the light emitting diode layer and a partition in a color conversion layer.

The aspects of the present inventive concept according to exemplary embodiments are not restricted to the one set forth herein, and another aspect which is not mentioned may be clearly understood by those skilled in the art from the description below.

According to some embodiments of the present inventive concept, there is provided a light emitting diode display device comprising a first light emitting diode pixel including a first light emitting diode layer and a first color conversion material on the first light emitting diode layer, a second light emitting diode pixel including a second light emitting diode layer and a second color conversion material on the second light emitting diode layer, a separation film disposed between the first light emitting diode layer and the second light emitting diode layer and a partition disposed between the first color conversion material and the second color conversion material and including a partition material, wherein the first and second light emitting diode pixels are divided by the separation film and the partition, the partition is disposed on the separation film in alignment with the separation film such that the partition includes linear portions that extend in a first direction and the separation film includes linear portions that also extend in the first direction and vertically overlap the linear portions of the partition, and the partition material includes an insulating material different from silicon.

According to some embodiments of the present inventive concept, there is provided a driving circuit board, a light emitting diode layer which is disposed on the driving circuit board and includes a first positive electrode and a first negative electrode, a separation film which is formed in the light emitting diode layer and formed on one side of the first positive electrode and the first negative electrode, a color conversion layer on the light emitting diode layer and a partition which is formed in the color conversion layer and disposed on the separation film in alignment with the separation film such that the partition includes linear portions that extend in a first direction and the separation film includes linear portions that also extend in the first direction and vertically overlap the linear portions of the partition.

According to some embodiments of the present inventive concept, there is provided a light emitting diode display device comprising a light emitting diode layer and a color conversion layer which is disposed on the light emitting diode layer and includes a first color conversion material, and a partition surrounding the first color conversion material, wherein the partition includes a first liner which is in contact with the first color conversion material and surrounds the first color conversion material, a second liner spaced apart from the first liner in a horizontal direction, a third liner which connects an upper part of the first liner and an upper part of the second liner, and a gap fill layer disposed under the third liner and located between the first and second liners.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Hereinafter, a light emitting diode display device according to some embodiments of the technical idea of the present inventive concept will be described with reference to FIGS. 1 to 3.

Figure 1:
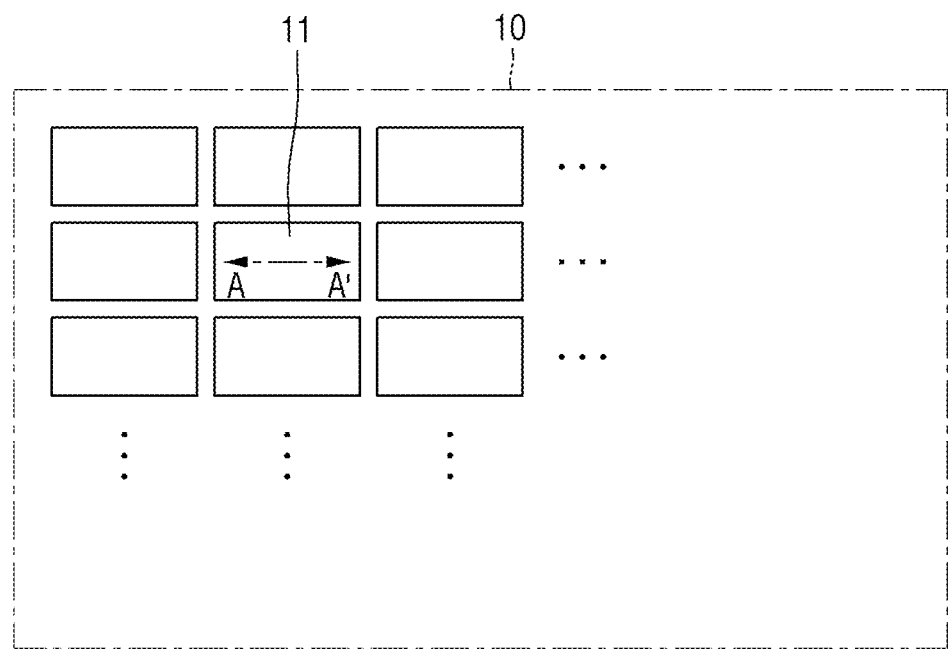
FIG. 1 is a layout diagram illustrating a light emitting diode display device according to some exemplary embodiments of the technical idea of the present inventive concept.

FIG. 1 is a layout diagram illustrating the light emitting diode display device according to some embodiments of the technical idea of the present inventive concept. FIG. 2 is a diagram for explaining a partition 230 of the light emitting diode display device according to some embodiments of the technical idea of the present inventive concept, and a driving circuit board 20 (see, e.g., FIG. 3) and a light emitting diode layer 100 (see, e.g., FIG. 3) are not illustrated for the sake of clarify of illustration. FIG. 3 is a cross-sectional view taken along line A-A' of FIGS. 1 and 2.

Figure 2:
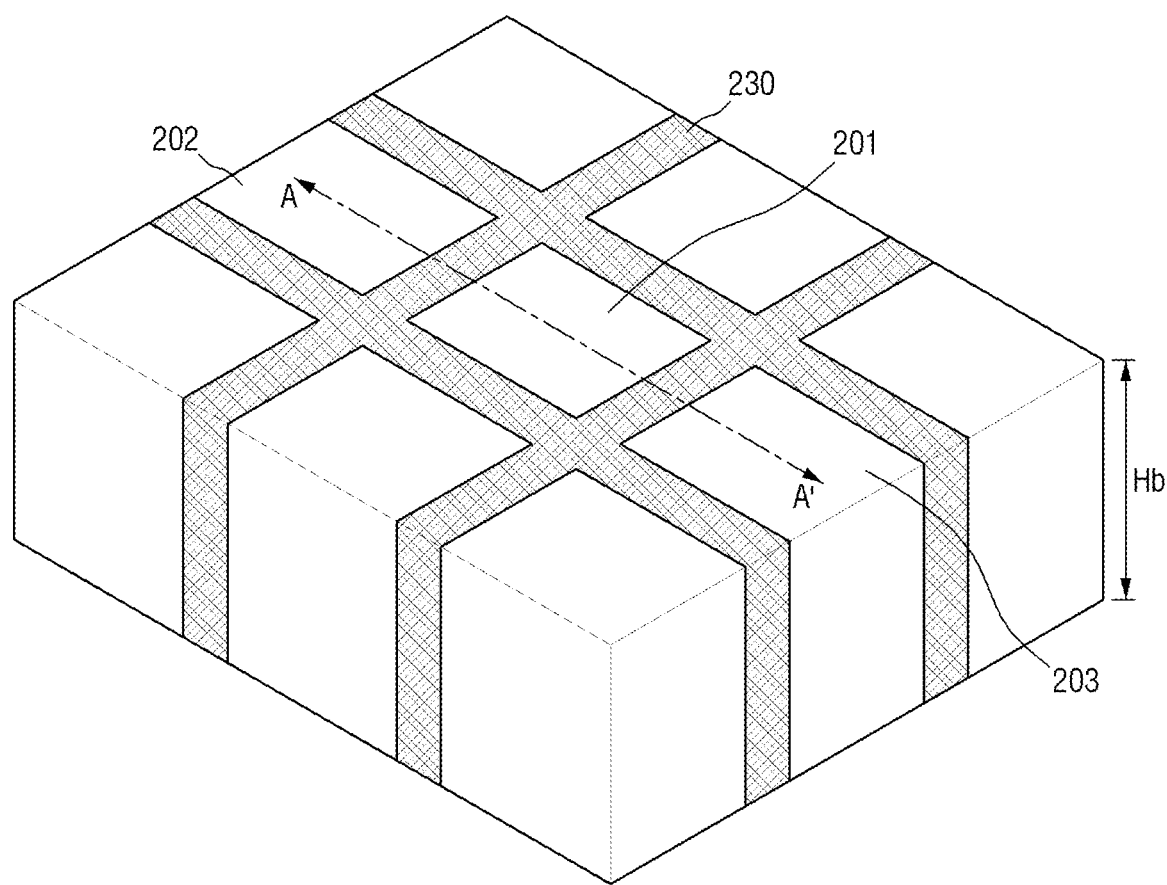
FIG. 2 is a diagram for explaining a partition of the light emitting diode display device according to some embodiments of the technical idea of the present inventive concept.
Figure 3:
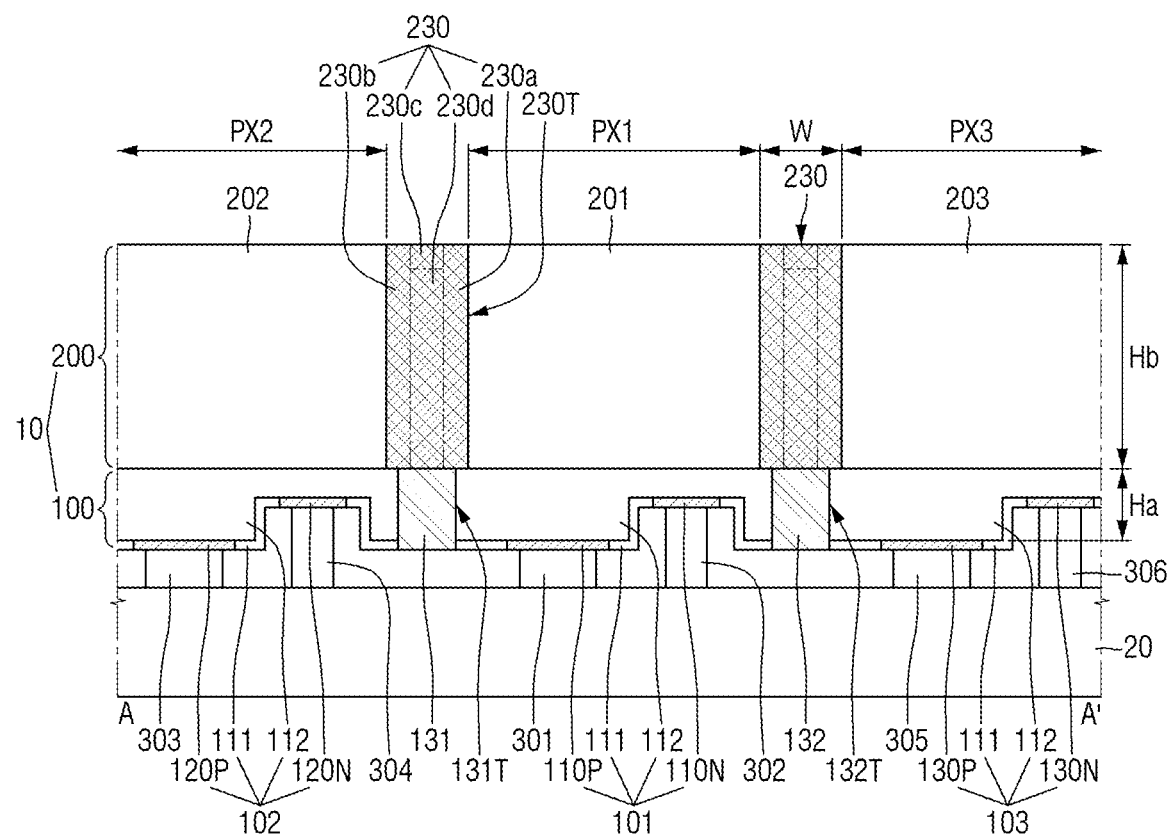
FIG. 3 is a cross-sectional view taken along line A-A' of FIGS. 1 and 2.

Referring to FIGS. 1 to 3, the light emitting diode display device according to some embodiments of the technical idea of the present inventive concept may include a display board 10 and a driving circuit board 20.

The display board 10 may include a plurality of unit pixels. Each of the plurality of unit pixels of the display board 10 may be regions of the display board 10 aligned to be spaced apart from each other in both column and row directions.

The plurality of unit pixels may include, for example, a first unit pixel 11. The first unit pixel 11 may include, for example, at least a part of the partition 230. Further, the first unit pixel 11 may include at least one of a first light emitting diode pixel PX1, a second light emitting diode pixel PX2, and a third light emitting diode pixel PX3. An example in which the first unit pixel 11 includes first, second and third light emitting diode pixels PX1, PX2, and PX3 will be described below. However, the technical idea of the present inventive concept is not limited thereto. For example, it is a matter of course that the first unit pixel 11 may include any number of light emitting diode pixels.

Detailed description of each of the first, second and third light emitting diode pixels PX1, PX2, and PX3 will be provided later.

The display board 10 may include a light emitting diode layer 100 and a color conversion layer 200. The color conversion layer 200 may be disposed on the light emitting diode layer 100.

A height Ha of the light emitting diode layer 100 may be, for example, about 5.5 µm to about 6 µm. A height Hb of the color conversion layer 200 may be, for example, about 30 to about 50 µm. Term such as "about" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range. The height Hb of the color conversion layer 200 may be, for example, the height of the partition 230. The height of the first, second, and third color conversion materials 201, 202, and 203 may be, for example, the same as the height Hb of the color conversion layer 200 (that is, the height of the partitions 230). For example, the uppermost surfaces of the first, second, and third color conversion materials 201, 202, and 203 and the partition 230 may be coplanar. However, the technical idea of the present inventive concept is not limited thereto. It is a matter of course that the height of the first, second and third color conversion materials 201, 202, and 203 may be greater or smaller than the height Hb of the color conversion layer 200 (that is, the height of the partition 230). Here, the heights Ha and Hb may be values measured in a direction perpendicular to the upper surface of the color conversion layer 200.

The relative sizes of constituent elements, layers and regions in the drawings may be exaggerated for clarity of illustration.

The light emitting diode layer 100 may include first, second and third light emitting diode layers 101, 102, and 103. Each of the first, second and third light emitting diode layers 101, 102, and 103 may be, for example, regions of the light emitting diode layer 100 divided by the first and second separation films 131 and 132.

The light emitting diode layer 100 may include first and second separation film trenches 131T and 132T formed in the light emitting diode layer 100. The first separation film trench 131T may be formed on one side of the first P electrode (positive electrode) 110P (or one side of the first N electrode (negative electrode) 110N). The second separation film trench 132T may be formed on the other side of the first P electrode 110P (or the other side of the first N electrode 110N). The first and second separation film trenches 131T and 132T may extend, for example, from the upper surface to the lower surface of the light emitting diode layer 100.

Each of the first and second separation films 131 and 132 may fill each of the first and second separation film trenches 131T and 132T, respectively. For example, the first separation film 131 may distinguish between the first light emitting diode layer 101 and the second light emitting diode layer 102. For example, the second separation film 132 may distinguish between the first light emitting diode layer 101 and the third light emitting diode layer 103.

In some embodiments, the first separation film 131 and the second separation film 132 may be one connected to each other. For example, the first and second separation films 131 and 132 may be disposed in the region of the light emitting diode layer 100 corresponding to the region in which the partition 230 is disposed. For example, the partition 230 may be disposed on the first separation film 131 and the second separation film 132 in alignment with the first separation film 131 and the second separation film 132 such that a bottom surface of the partition 230 covers (e.g., vertically overlaps) an upper surface of each of the first separation film 131 and the second separation film 132. In this exemplary embodiment, the first and second separation films 131 and 132 are connected to each other and may wrap around and fully surround the first light emitting diode layer 101 with respect to a top-down view (e.g., they may form part of a grid pattern).

As can be seen from FIGS. 2 and 3, from a top-down view, the partition 230 may fully overlap and cover the separation film formed by the first and second separation films 131 and 132 (also described together as a separation film portions 131 and 132). The separation film including separation film portions 131 and 132 may form a single continuous pattern, similar to the pattern shown for the partition 230. Thus, a separation film may be formed beneath the partition 230 such that both have the same pattern (which may be a grid pattern or other same-shaped pattern) including linear portions that extend in the same directions and vertically overlap each other, from a top-down view. As shown in FIGS. 2 and 3, pitches between the linear portions may be the same for the partition 230 as for the separation film. Also central linear axes of the linear portions may overlap from a top-down view, such that the linear portions are centered and formed along the same axes for both the partition 230 and the separation film. In the embodiments shown in FIGS. 2 and 3, the partition 230 includes first linear portions that extend in a first direction and the separation film includes first linear portions that also extend in the first direction and vertically overlap the first linear portions of the partition 230. The partition 230 may also include second linear portions that extend in a second direction (e.g., perpendicular to or crossing the first direction) and the separation film includes second linear portions that also extend in the second direction and vertically overlap the second linear portions of the partition 230.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The side walls of each of the first and second separation films 131 and 132 may have, for example, an inclination substantially perpendicular to the color conversion layer 200. Since the first and second separation films 131 and 132 are epitaxially grown from the substrate (200pre of FIG. 12), the respective side walls of the first and second separation films 131 and 132 may have an inclination substantially perpendicular to the color conversion layer 200. Details of the formation of the respective side walls of the first and second separation films 131 and 132 will be described later with reference to FIGS. 10 to 17. However, the technical idea of the present inventive concept is not limited to a configuration in which the side walls of each of the first and second separation films 131 and 132 have an inclination substantially perpendicular to the color conversion layer 200. For example, even if the first and second separation films 131 and 132 are formed epitaxially grown from the substrate (200pre of FIG. 12), it is a matter of course that each side wall of the first and second separation films 131 and 132 may have any inclination that is not perpendicular to the color conversion layer 200.

The first and second separation films 131 and 132 may include, for example, an insulating material. For example, the first and second separation films 131 and 132 may include may at least one of silicon oxide and silicon nitride.

The color conversion layer 200 may include first, second and third color conversion materials 201, 202, and 203. Each of the first, second and third color conversion materials 201, 202, and 203 may be, for example, a material filled in the region of the color conversion layer 200 partitioned by the partition 230.

The first color conversion material 201 may be disposed on the first light emitting diode layer 101. The second color conversion material 202 may be disposed on the second light emitting diode layer 102. The third color conversion material 203 may be disposed on the third light emitting diode layer 103.

Each of the first, second and third color conversion materials 201, 202, and 203 may convert monochromatic light irradiated toward each of the first, second and third color conversion materials 201, 202, and 203 from each of the first, second and third light emitting diode layers 101, 102, and 103 into monochromatic light of another color. The first, second and third color conversion materials 201, 202, and 203 may include, for example, a phosphor layer or a quantum dot.

A color filter layer may be disposed on the first, second and third color conversion materials 201, 202, and 203. In the case where the color filter layer is disposed on the first, second and third color conversion materials 201, 202, and 203, for example, RGB three primary colors may be implemented in the first unit pixel 11.

The color conversion layer 200 may include a partition trench 230T formed in the color conversion layer 200. The partition trench 230T may expose the first and second separation films 131 and 132. The partition trench 230T may be formed between the first color conversion material 201 and the second color conversion material 202, and between the first color conversion material 201 and the third color conversion material 203.

The color conversion layer 200 may include a partition 230 which fills the partition wall trench 230T. The partition 230 may define, for example, each of the first, second and third color conversion materials 201, 202, and 203. The partitions 230 may be formed to surround, for example, each of the first, second, and third color conversion materials 201, 202, and 203. The partition 230 may separate the first color conversion material 201 and the second color conversion material 202. In addition, the partition 230 may separate the first color conversion material 201 and the third color conversion material 203.

The partition 230 may be disposed on the first and second separation films 131 and 132 in alignment with the first and second separation films 131 and 132. At least a part of the partition 230 may vertically overlap at least a part of the first separation film 131 and at least a part of the second separation film 132, on the basis of the upper surface of the color conversion layer 200. For example, at least a part of the first and second separation films 131 and 132 may be overlaid by the partition 230. For example, the upper surface of each of the first separation film 131 and the second separation film 132 may cover at least about 50% to about 90% of the surface area of the bottom surface the partition 230. The upper surface of each of the first separation film 131 and the second separation film 132 may contact the bottom surface the partition 230

In the light emitting diode display device according to some embodiments of the technical idea of the present inventive concept, by aligning the partition 230 and the first and second separation films 131 and 132, the yield of the light emitting diode display device can be improved.

The side wall of the partition 230 may have, for example, a vertical inclination with respect to the upper surface of the light emitting diode layer 100.

The thickness W of the partition 230 may be, for example, about 10 μm to about 15 μm. The thickness W of the partition 230 may be larger than, for example, the thickness of each of the first and second separation films 131 and 132. However, the technical idea of the present inventive concept is not limited thereto. For example, it is a matter of course that the thickness W of the partition 230 may be the same as the thickness of each of the first and second separation films 131 and 132, and may be smaller than the thicknesses of each of the first and second separation films 131 and 132. The thickness W of the partition 230 may be a value measured in a direction parallel to the upper surface of the color conversion layer 200.

The partition 230 may include a first liner 230a, a second liner 230b, a third liner 230c and a gap fill layer 230d.

For example, the first liner 230a may contact the first color conversion material 201. The first liner 230a does not fill the partition trench 230T and may be disposed along the side wall of the partition trench 230T. The first liner 230a may, for example, surround the first color conversion material 201. It will be understood that when an element is referred to as contacting another element, there are no intervening elements present at the point of contact.

For example, the second liner 230b may be spaced apart from the first liner 230a in the partition trench 230T in a horizontal direction (a direction parallel to the upper surface of the light emitting diode layer 100). The second liner 230b, for example, may contact the second color conversion material 202. The second liner 230b may surround, for example, the second color conversion material 202. The second liner 230b does not fill the partition trench 230T and may be disposed along the side wall of the partition trench 230T.

The third liner 230c may connect, for example, the upper part of the first liner 230a and the upper part of the second liner 230b. The third liner 230c may not fill the partition trench 230T.

The gap fill layer 230d may be disposed between the first liner 230a and the second liner 230b. The gap fill layer 230d may fill a portion of the partition trench 230T which is left after the first liner 230a, the second liner 230b, and the third liner 230c are disposed. The gap fill layer 230d may be disposed under the third liner 230c. For example, inner side walls of the first liner 230a and the second liner 230b are coplanar with outer sidewalls of the gap fill layer 230d, and the bottom surface of the third liner 230c and upper surface of the gap fill layer 230d are coplanar. According to exemplary embodiments, the upper surface of each of the first separation film 131 and the second separation film 132 may completely cover the bottom surface the gap fill layer 230d and partially cover the bottom surface of each of the first liner 230a and the second liner 230b.

The partition 230 may include, for example, silicon and a partition material having etching selectivity. The partition material may be, for example, a material contained in the substrate (200pre of FIG. 10) and a material having etching selectivity for the same etchant. For example, because of the partition material, the substrate (200pre of FIG. 10) is etched for the same etchant, but the partitions 230 may not be etched.

The partition material included in the partition 230 may include, for example, an insulating material different from silicon. The partition material may include, for example, at least one of silicon oxide and silicon nitride.

In some embodiments, the first liner 230a, the second liner 230b, the third liner 230c and the gap fill layer 230d may include the same material composition. For example, the first liner 230a, the second liner 230b, the third liner 230c, and the gap fill layer 230d may include a partition material. For example, the first liner 230a, the second liner 230b, the third liner 230c and the gap fill layer 230d may include at least one of silicon oxide and silicon nitride. In this exemplary embodiment, the first liner 230a, the second liner 230b, the third liner 230c and the gap fill layer 230d may be seen as one continuous constituent element.

The first light emitting diode pixel PX1 may include a first light emitting diode layer 101 and a first color conversion material 201. The second light emitting diode pixel PX2 may include a second light emitting diode layer 102 and a second color conversion material 202. The third light emitting diode pixel PX3 may include a third light emitting diode layer 103 and a third color conversion material 203.

The first light emitting diode pixel PX1 and the second light emitting diode pixel PX2 may be divided by the partition 230 and the first separation film 131. The first light emitting diode pixel PX1 and the third light emitting diode pixel PX3 may be divided by the partition 230 and the second separation film 132.

Each of the first, second and third light emitting diode layers 101, 102, and 103 may include an insulating layer 111 and a base layer 112.

In the drawings, although each of the first, second and third light emitting diode layers 101, 102, and 103 is illustrated to include only the insulating layer 111 and the base layer 112, the inventive concept is not limited thereto. Alternatively, for example, the first, second and third light emitting diode layers 101, 102, and 103 may, of course, further include additional layers.

In some embodiments, the insulating layer 111 may be a single layer. In some embodiments, the insulating layer 111 may be a multi-layer. When the lower layer 121 is the multi-layer, the insulating layer 111 may further include a reflective layer.

The base layer 112 may be disposed on the insulating layer 111. The base layer 112 may include, for example, a base substrate. The base substrate may be, for example, sapphire glass, but the technical idea of the present inventive concept is not limited thereto.

In the drawings, the base layer 112 is illustrated as a single layer, but the technical idea of the present inventive concept is not limited thereto. For example, it is a matter of course that the base layer 112 may be a multi-layer in which various layers are stacked.

The base layer 112 may include, for example, a nitride-based semiconductor material. The base layer 112 may include, for example, at least one of GaN, AlGaN, InGaN, AlInGaN, and combinations thereof.

In the drawings, the insulating layer 111 and the base layer 112 are illustrated to each include a portion having a step, but the technical idea of the present inventive concept is not limited thereto. For example, it is a matter of course that the insulating layer 111 and the base layer 112 have no step.

Each of the first, second and third P electrodes 110P, 120P, and 130P may be disposed in the insulating layer 111. Each of the first, second and third N electrodes 110N, 120N, and 130N may be disposed in the insulating layer 111. The first P electrode 110P may be disposed apart from the first N electrode 110N in the insulating layer 111 of the first light emitting diode layer 101. The second P electrode 120P may be disposed apart from the second N electrode 120N in the insulating layer 111 of the second light emitting diode layer 102. The third P electrode 130P may be disposed apart from the third N electrode 130N in the insulating layer 111 of the third light emitting diode layer 103. The first, second and third P electrodes 110P, 120P, and 130P and the first, second and third N electrodes 110N, 120N, and 130N may include a conductive material, e.g., metal (Cr/Au).

Each of the first, second, and third P electrodes 110P, 120P, and 130P may be electrically connected to the driving transistor of the driving circuit board 20. Each of the first, second and third N electrodes 110N, 120N, and 130N may be connected to, for example, a ground voltage. As used herein, and unless indicated otherwise, items described as being "electrically connected" are configured such that an electrical signal can be passed from one item to the other.

The driving circuit board 20 may be electrically connected to the display board 10. For example, the first, second and third light emitting diode pixels PX1, PX2, and PX3 may be electrically connected to the driving circuit board 20. The display board 10 may, for example, be disposed on the driving circuit board 20. For example, the first, second and third light emitting diode layers 101, 102, and 103 may be disposed on the driving circuit board 20.

The driving circuit board 20 is electrically connected to the light emitting diode layer 100 and may drive the light emitting diode including the light emitting diode layer 100.

The driving circuit board 20 includes a driving transistor connected to P electrodes (for example, first, second, and third P electrodes 110P, 120P, and 130P) included in the light emitting diode layer 100.

In some embodiments, the driving circuit board 20 and the display board 10 may be electrically connected via at least one bump 301, 302, 303, 304, 305, and 306. The at least one bump 301, 302, 303, 304, 305, and 306 may be interposed, for example, between the display board 10 and the driving circuit board 20. At least one bump 301, 302, 303, 304, 305, and 306 may be interposed, for example, between the light emitting diode layer 100 and the driving circuit board 20.

For example, each of the first, second and third P electrodes 110P, 120P, and 130P may be connected to the driving circuit board 20 through each of the first, third and fifth bumps 301, 303, and 305. For example, each of the first, second, and third N electrodes 110N, 120N, and 130N may be connected to the driving circuit board 20 through each of the second, fourth and sixth bumps 302, 304, and 306.

Hereinafter, the light emitting diode display device according to some embodiments of the technical idea of the present inventive concept will be described with reference to FIG. 4. For the sake of clarity of explanation, repeated part of the aforementioned description will be simplified or omitted.

Figure 4:
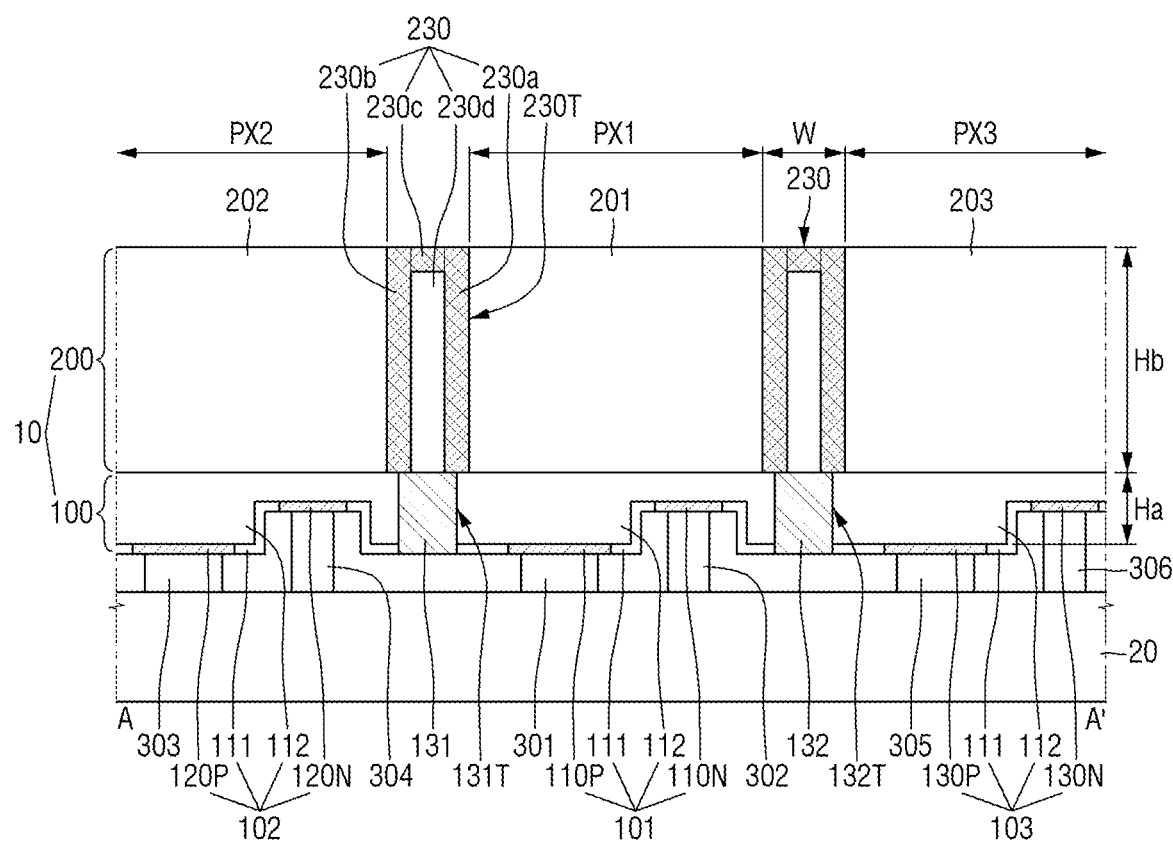
FIG. 4 is a cross-sectional view taken along line A-A' of FIG. 1.

FIG. 4 is a cross-sectional view taken along line A-A' of FIG. 1.

Referring to FIG. 4, the gap fill layer 230d of the partition 230 may include a material different from the materials contained in the first, second and third liners 230a, 230b, and 230c.

For example, the first, second and third liners 230a, 230b, and 230c may include the same material composition. For example, the first, second and third liners 230a, 230b, and 230c may include a partition material. In this exemplary embodiment, the first, second and third liners 230a, 230b, and 230c may be seen as one continuous constituent element. The gap fill layer 230d may include, for example, either silicon or a metal material.

Hereinafter, the light emitting diode display device according to some embodiments of the technical idea of the present inventive concept will be described with reference to FIG. 5. For the sake of clarity of explanation, repeated part of the aforementioned description will be simplified or omitted.

Figure 5:
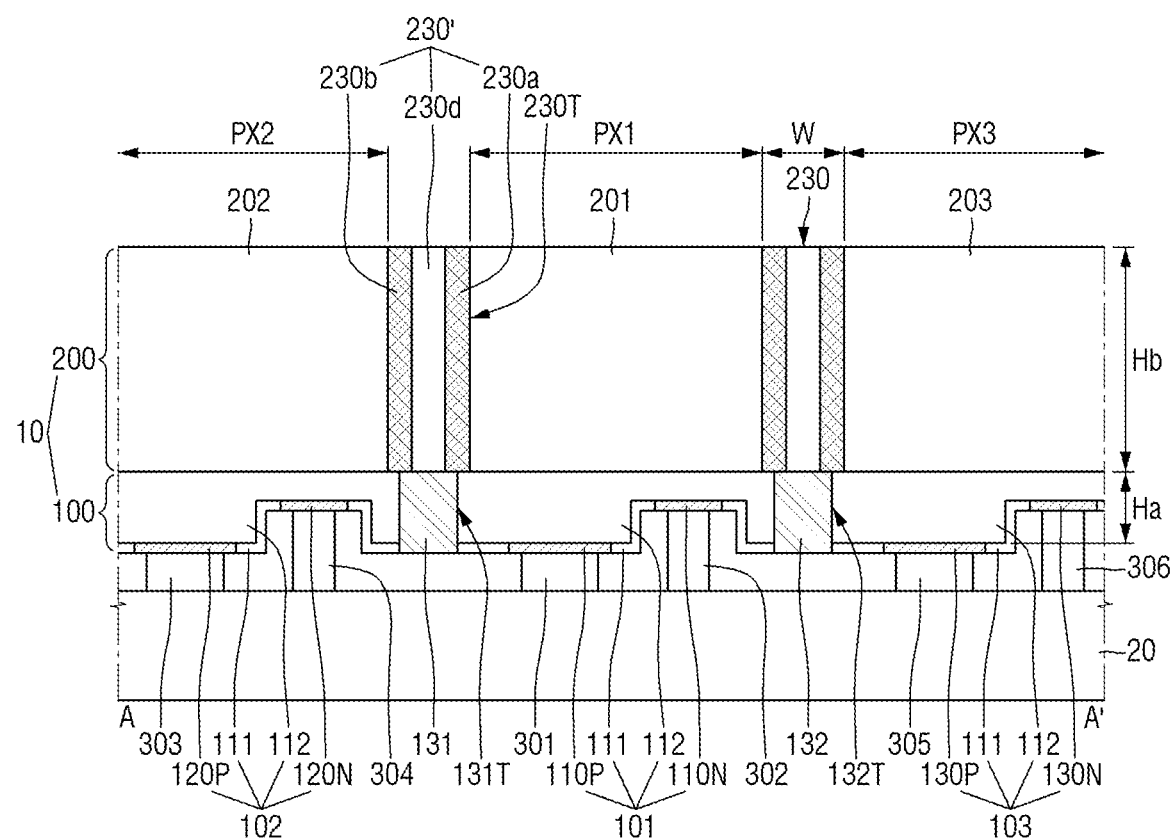
FIG. 5 is a cross-sectional view taken along line A-A' of FIG. 1.

FIG. 5 is a cross-sectional view taken along line A-A' of FIG. 1.

Referring to FIG. 5, a partition 230' may not include the third liner 230c. The gap fill layer 230d may be disposed between the first and second liners 230a and 230b to fill the partition trench 230T. Thus, according to this exemplary embodiment, inner side walls of the first liner 230a and the second liner 230b are coplanar with outer sidewalls of the gap fill layer 230d, the bottom surface of the gap fill layer 230d is coplanar with the bottom surface of each of the first liner 230a, and the second liner 230b and the upper surface of the gap fill layer 230d is coplanar with the upper surface of each of the first liner 230a and the second liner 230b.

The gap fill layer 230d may include a material different from the materials contained in the first and second liners 230a and 230b. For example, the first and second liners 230a and 230b may include the same material composition. For example, the first and second liners 230a and 230b may include a partition material.

The gap fill layer 230d may include, for example, either silicon or a metal material.

Hereinafter, the light emitting diode display device according to some embodiments of the technical idea of the present inventive concept will be described with reference to FIGS. 6 to 9. For the sake of clarity of explanation, repeated part of the aforementioned description will be simplified or omitted.

Figure 6:
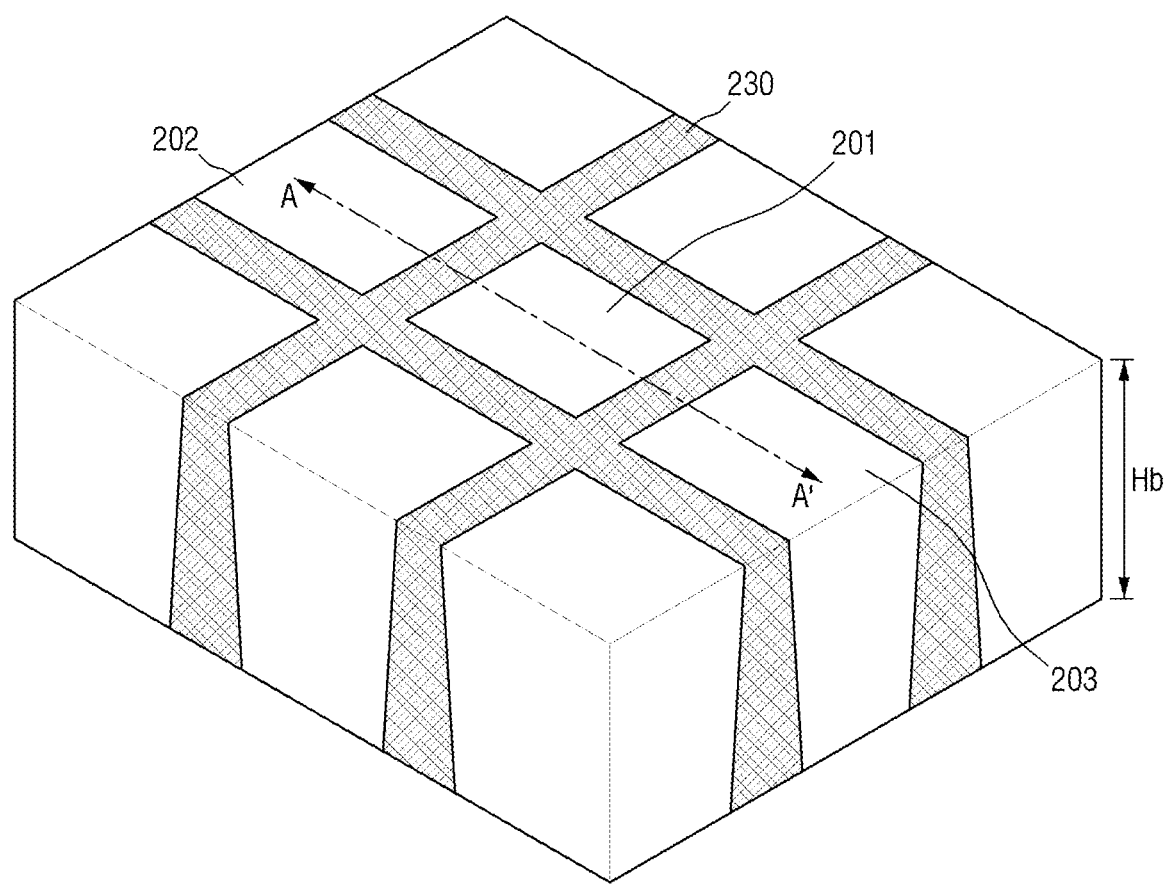
FIG. 6 is a diagram for explaining the partition of the light emitting diode display device according to some embodiments of the technical idea of the present inventive concept.

FIG. 6 is a diagram for explaining a partition 230 of the light emitting diode display device according to some embodiments of the technical idea of the present inventive concept. Each of FIGS. 7, 8 and 9 is a cross-sectional view taken along the line A-A' of FIGS. 1 and 6, respectively.

Figure 7:
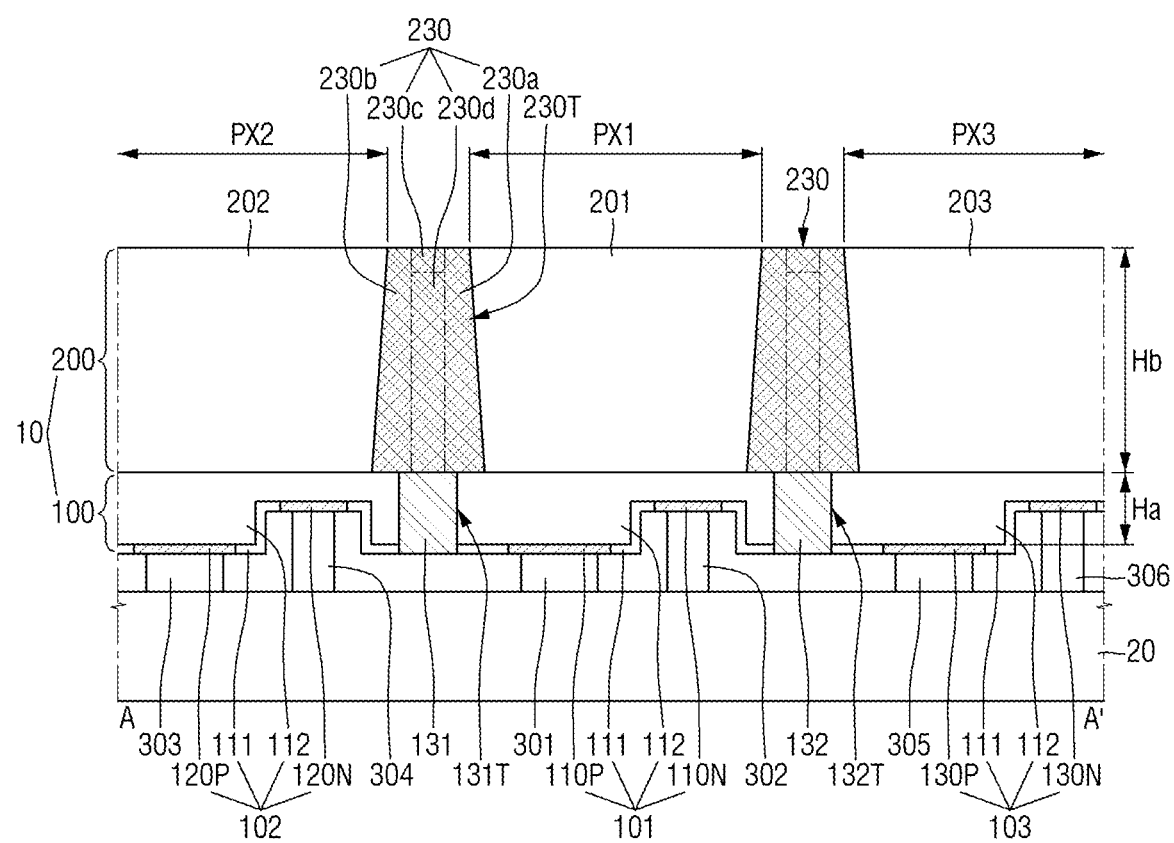
FIGS. 7, 8 and 9 are cross-sectional views taken along the line A-A' of FIGS. 1 and 6, respectively.

Referring to FIGS. 6 and 7, the side walls of the partition trench 230T of the light emitting diode display according to some embodiments of the technical idea of the present inventive concept may have an arbitrarily inclination, rather than a vertical inclination. The side wall of the partition wall trench 230T may have an inclination of about 15 degrees or less, for example, with reference to a normal perpendicular to the upper surface of the color conversion layer 200. Therefore, the width of the partition 230 may gradually decrease along the direction away from the light emitting diode layer 100.

When the width of the partition 230 gradually decreases along the direction away from the light emitting diode layer 100, the light-gathering power of light generated from the light emitting diode layer 100 may be improved.

Figure 8:
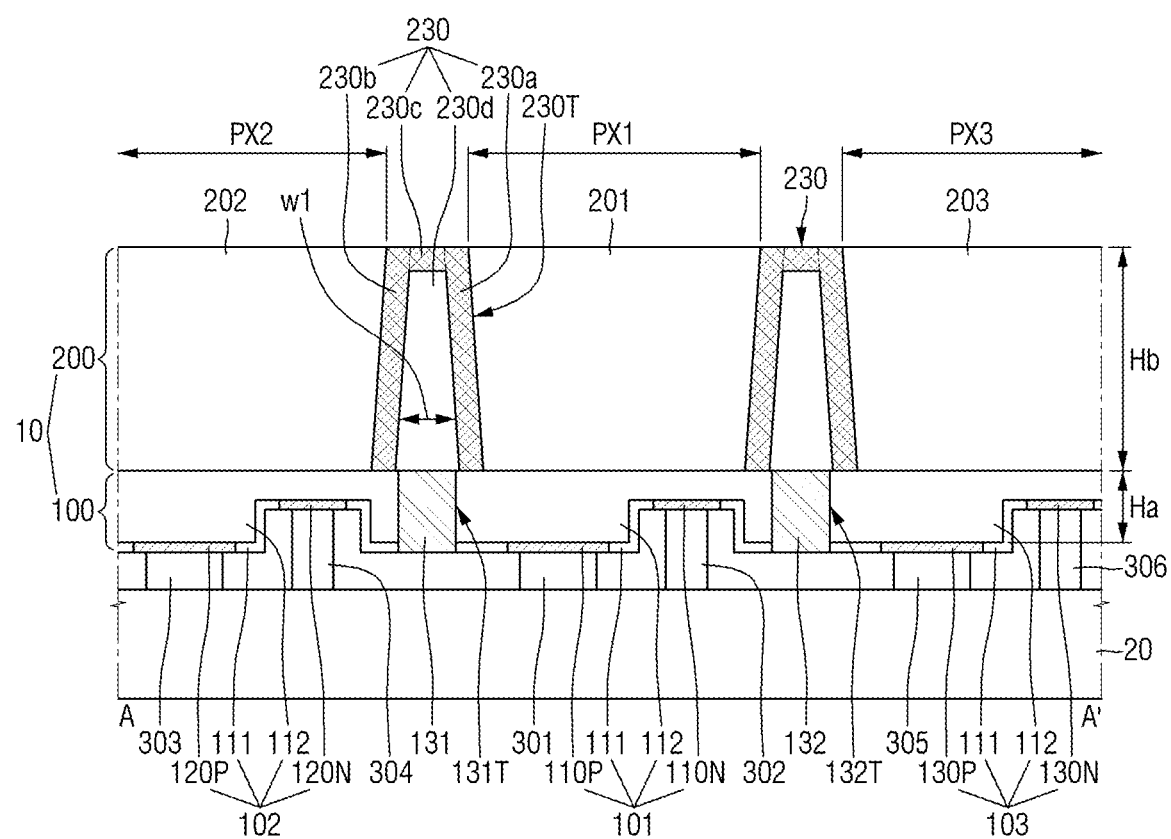
Figure 9:
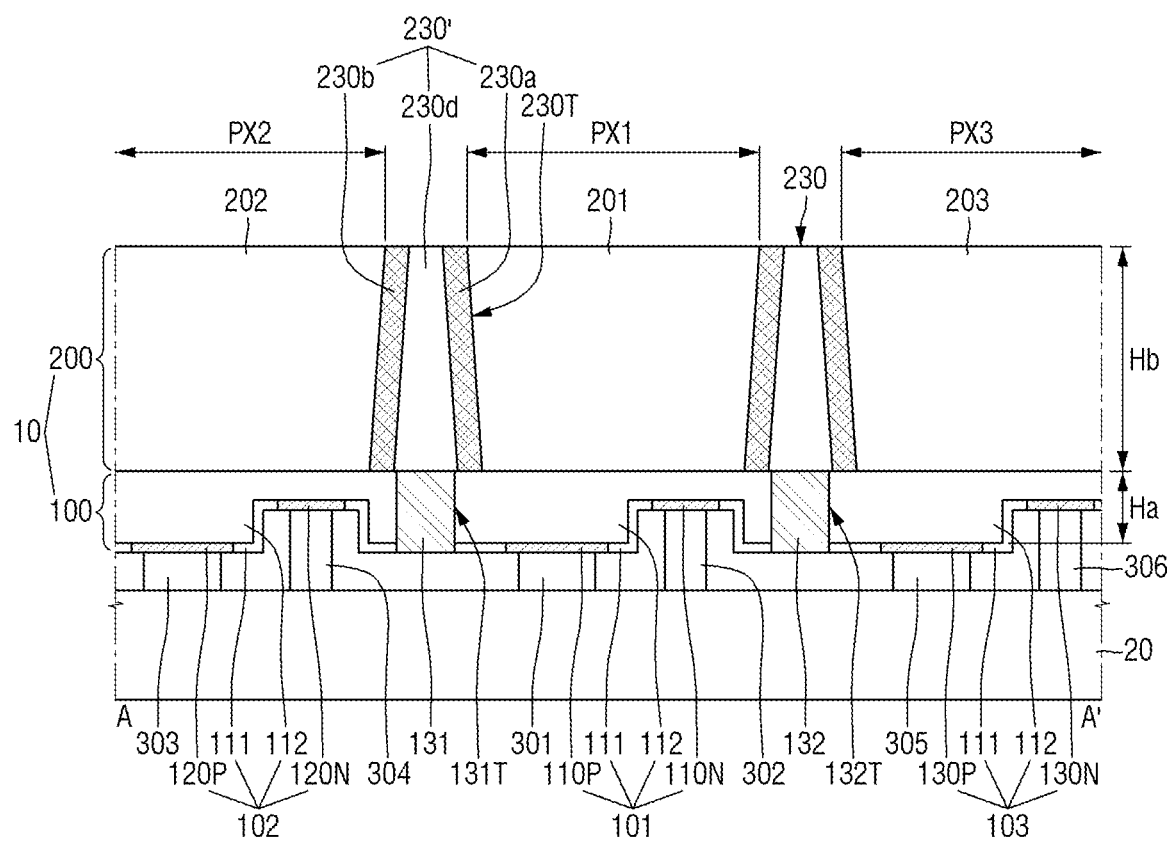

Referring to FIGS. 8 and 9, the first and second liners 230a and 230b may be disposed along the profile of the side wall of the partition trench 230T. Thus, according to this exemplary embodiment, the width w1 of the gap fill layer 230d gradually decreases along the direction away from the light emitting diode layer 100.

A method for manufacturing the light emitting diode display device according to some embodiments of the technical idea of the present inventive concept will be described below with reference to FIGS. 10A, 10B, 11A, 11B, 12, 13, 14, 15, 16 and 17. For the sake of clarity of explanation, repeated part of the aforementioned description will be simplified or omitted.

Each of FIGS. 10A, 10B, 11A, 11B, 12, 13, 14, 15, 16, and 17 is an intermediate step diagram for explaining the method for manufacturing the light emitting diode display device according to some embodiments of the technical idea of the present inventive concept.

Figure 10A:
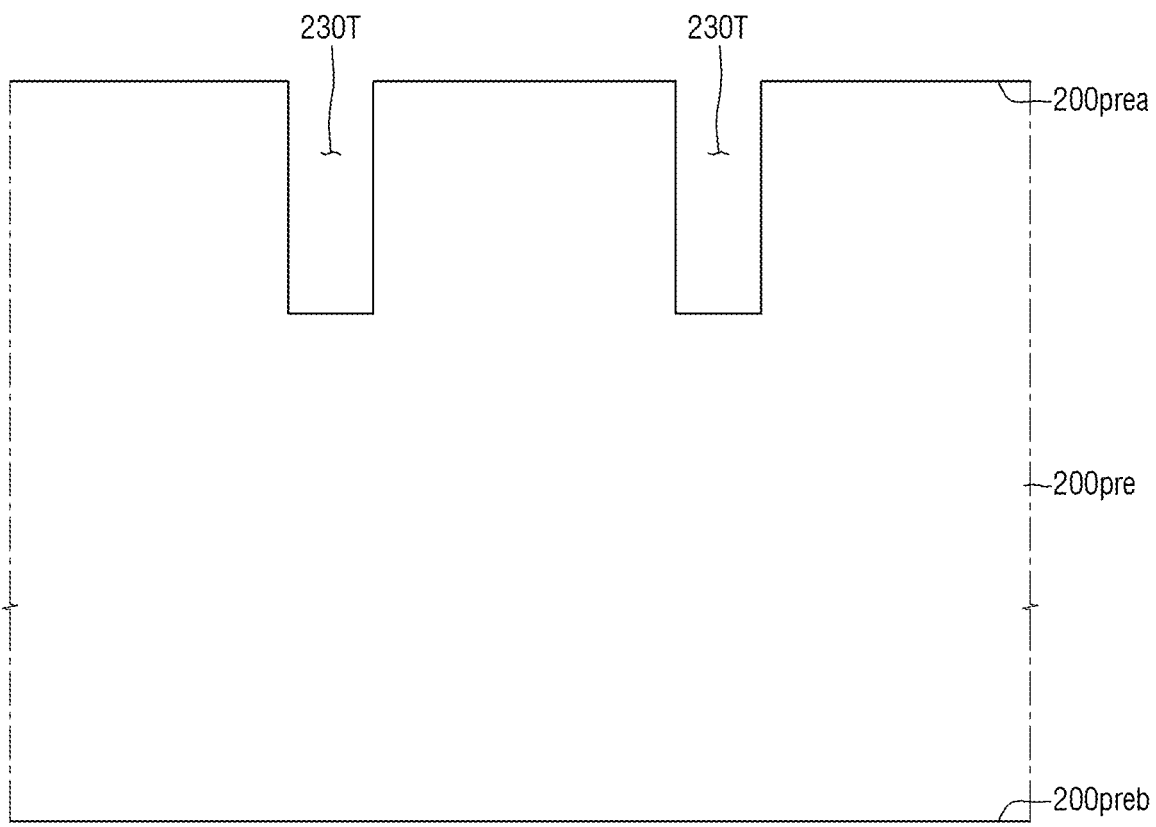
FIGS. 10A, 10B, 11A, 11B, 12, 13, 14, 15, 16, and 17 are intermediate step diagrams for explaining a method for manufacturing a light emitting diode display device according to some embodiments of the technical idea of the present inventive concept.

Referring to FIG. 10A, a substrate 200pre may be provided. The substrate 200pre may include a first surface 200prea and a second surface 200preb facing each other.

The partition wall trench 230T may be formed in the substrate 200pre. The partition trench 230T may be formed by removing a part of the substrate 200pre. The partition trench 230T extends from the first surface 200prea of the substrate 200pre into the substrate 200pre, but may not extend to the second surface 200preb of the substrate 200pre.

In some embodiments, the substrate 200pre may include undoped silicon. Or, in some embodiments, the substrate 200pre may include silicon doped with high concentration boron.

In FIG. 10A, and the side wall of the partition trench 230T may have an inclination perpendicular to the first surface 200prea of the substrate 200pre.

Figure 10B:
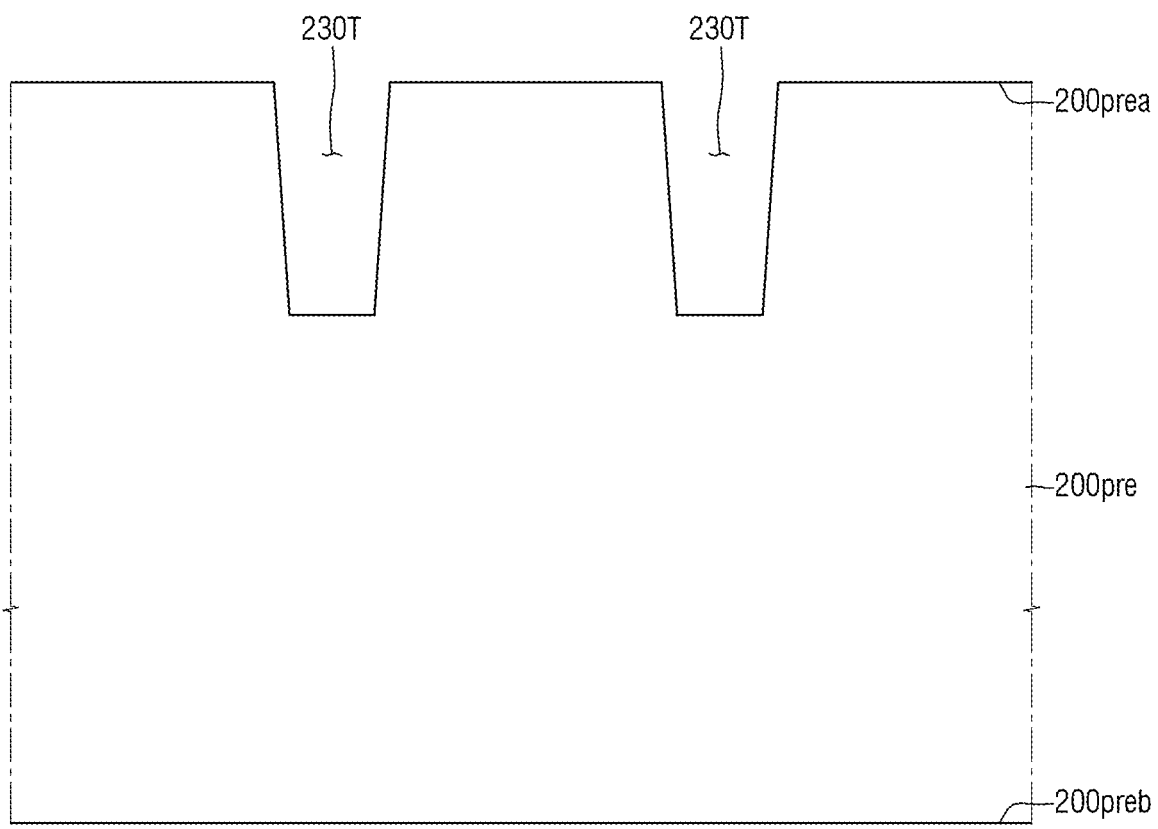

Alternatively, in some embodiments, as illustrated in FIG. 10B, the side wall of the partition trench 230T may have an arbitrary inclination with respect to the first surface 200prea of the substrate 200pre. When the side wall of the partition trench 230T has an arbitrary inclination with respect to the first surface 200prea of the substrate 200pre, the width of the partition trench 230T may gradually increase in a direction from the first surface 200prea of the substrate 200pre toward the second surface 200preb. The side wall of the partition trench 230T may have, for example, an inclination of about 15 degrees with respect to a normal perpendicular to the first surface 200prea of the substrate 200pre.

Hereinafter, the shape of the partition wall trench 230T of FIG. 10A will be described as an example. However, the following explanation may, of course, be applied to the partition trench 230T of FIG. 10B.

Figure 11A:
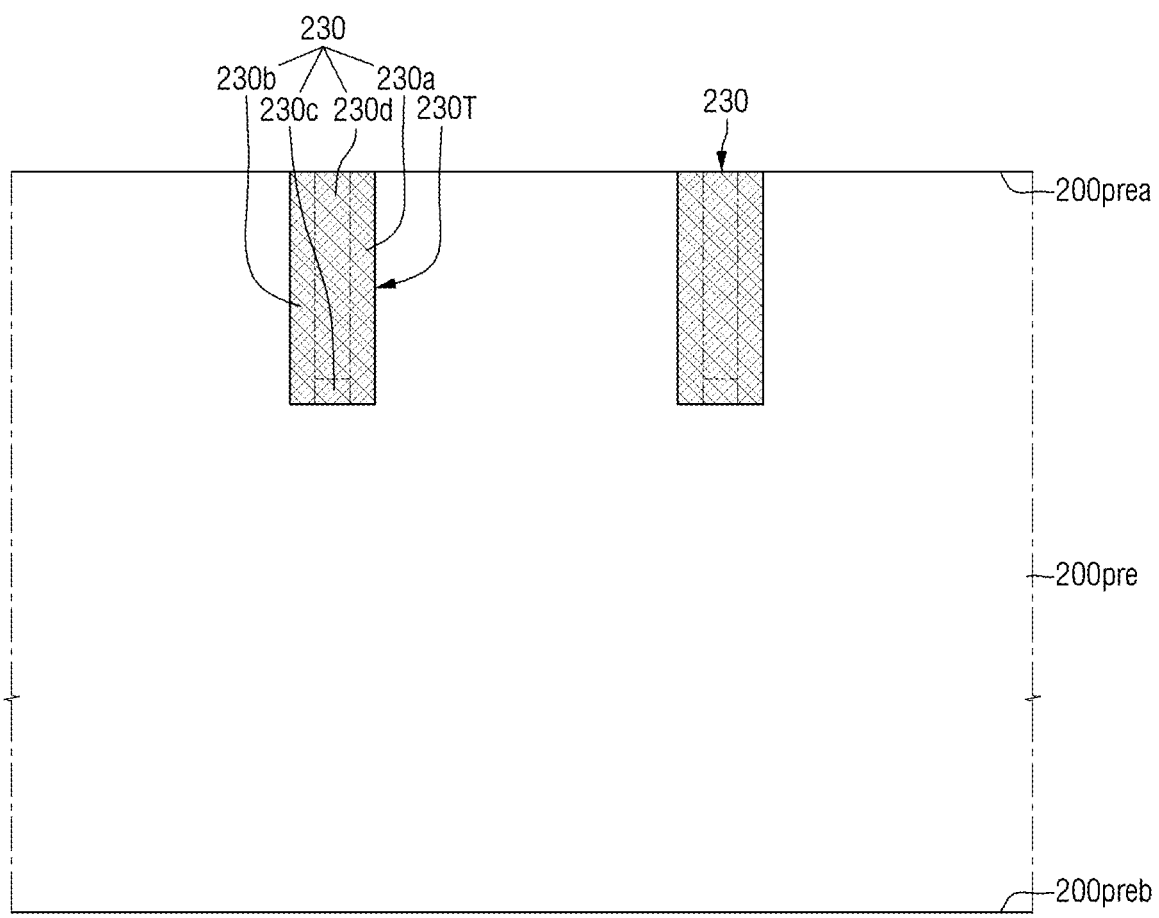

Referring to FIG. 11A, the partition 230 may be formed. The partition 230 may by filling all the partition trenches 230T with the partition material.

Each of the first liner 230a, the second liner 230b, the third liner 230c and the gap fill layer 230d may include the same material, for example, a partition material. When the first liner 230a, the second liner 230b, the third liner 230c, and the gap fill layer 230d include the same material, for example, the first liner 230a, the second liner 230b, the third liner 230c and the gap fill layer 230d may be formed at the same time.

The partition material may include an oxide of a material contained in the substrate 200pre. The partition material may be, for example, silicon oxide.

The partition material may include insulating materials different from silicon. For example, the partition material may include at least one of silicon oxide and silicon nitride.

The partition material may include a material contained in the substrate 200pre and a material having etching selectivity. For example, the partition material may include a material in which the substrate 200pre is etched but the partition 230 may not be etched for the same etchant. For example, in the case where the substrate 200pre contains undoped silicon, the partition material may include at least one of silicon oxide and silicon nitride. For example, when the substrate 200pre includes silicon doped with high concentration boron, the partition material may be, for example, silicon.

Figure 11B:
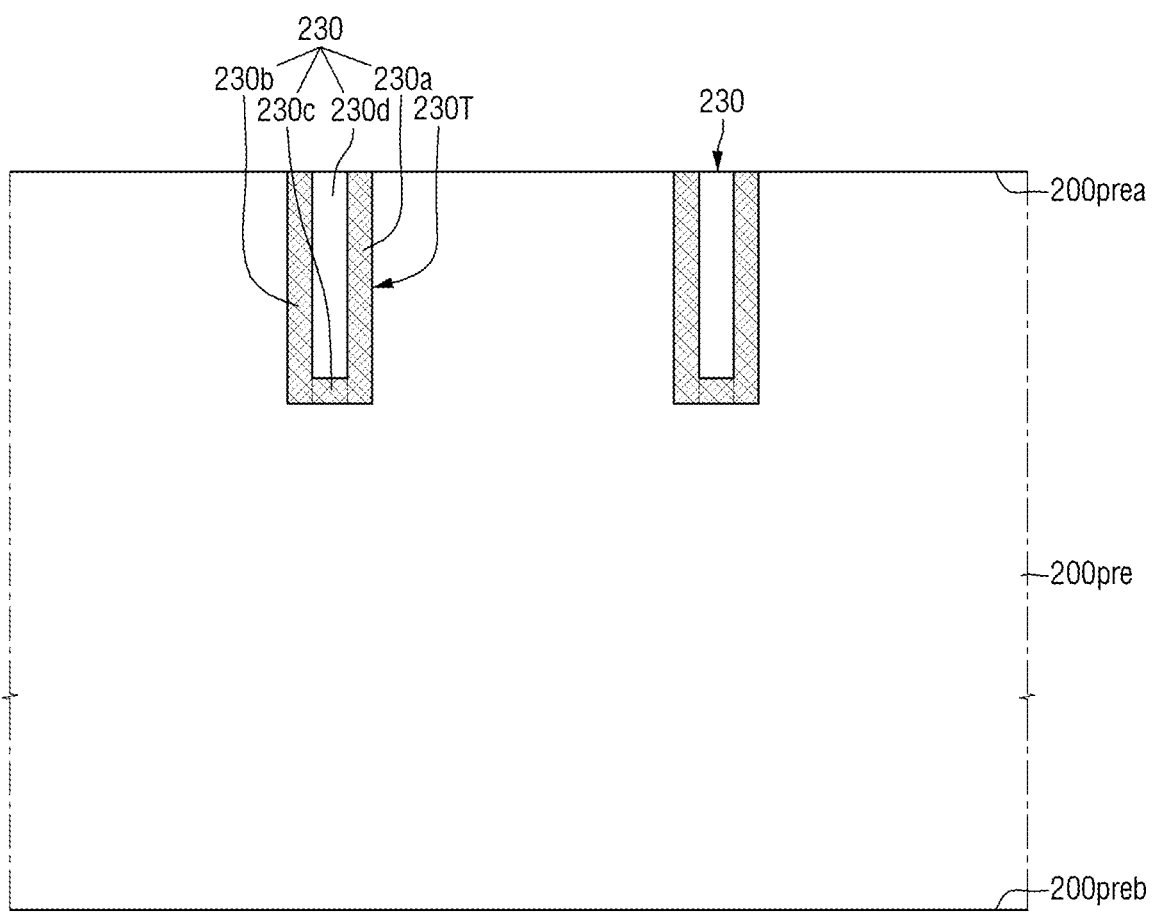

On the other hand, in some embodiments, the first liner 230a, the second liner 230b, and the third liner 230c include the same material composition, and the gap fill layer 230d may include a material different from the material included in the first liner 230a, the second liner 230b, and the third liner 230c. Referring to FIG. 11B, the first liner 230a, the second liner 230b and the third liner 230c may be formed along the side walls and the bottom surface of the partition trench 230T. The first liner 230a, the second liner 230b and the third liner 230c may be formed along the profile of the partition trench 230T.

For example, the first liner 230a and the second liner 230b may be formed along side walls of the partition trench 230T. Further, the third liner 230c may be formed along the bottom surface of the partition trench 230T to connect the first liner 230a and the second liner 230b. The first liner 230a, the second liner 230b and the third liner 230c may not fill the partition trench 230T.

Portions of the partition trench 230T that are not filled by the first liner 230a, the second liner 230b and the third liner 230c may be filled by the gap fill layer 230d.

In some embodiments, each of the first liner 230a, the second liner 230b, and the third liner 230c may include the same material composition, e.g., a partition material.

The gap fill layer 230d may include, for example, either silicon or a metal material.

Figure 12:
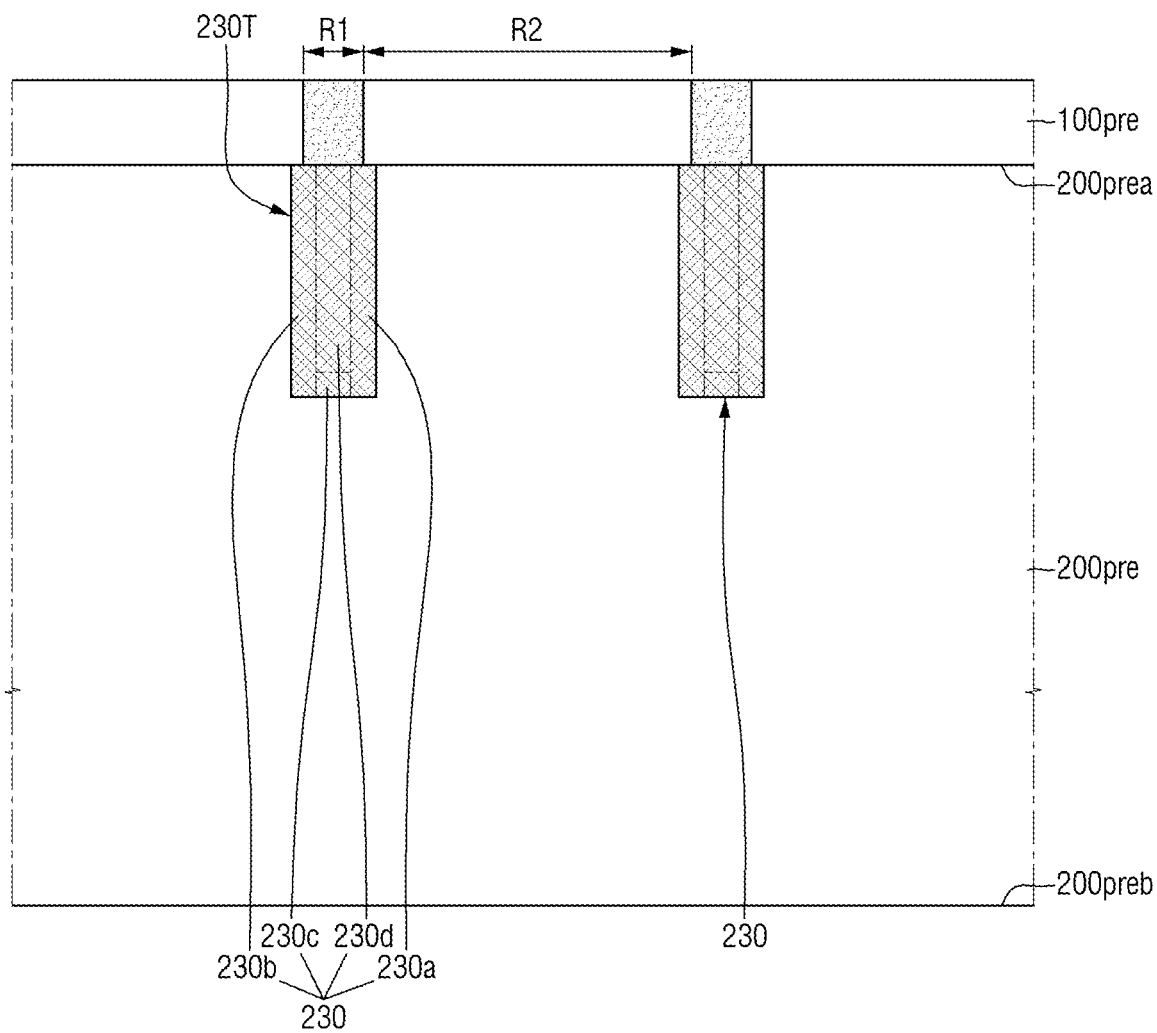

Referring to FIG. 12, a pre-light emitting diode layer 100pre may be formed on the partition 230 and the substrate 200pre. For example, the pre-light emitting diode layer 100pre may be formed on the first surface 200prea of the substrate 200pre.

The pre-light emitting diode layer 100pre may, for example, be epitaxially grown on the partition 230 and the substrate 200pre. The pre-light emitting diode layer 100pre may include a first portion R1 and a second portion R2. The first portion R1 of the pre-light emitting diode layer 100pre may include a portion epitaxially grown on the partition 230. The second portion R2 of the pre-light emitting diode layer 100pre may include a portion which is epitaxially grown on the substrate 200pre.

Each of the first portion R1 and the second portion R2 of the pre-light emitting diode layer 100pre may include materials having different crystal directions. For example, in the case where the substrate 200pre contains silicon, the crystal direction of the material included in the second portion R2 epitaxially grown on the substrate 200pre including silicon may differ from the crystal direction of the material contained in the first portion R1 epitaxially grown on the partition 230 including the partition material.

For example, the pre-light emitting diode layer 100pre may include GaN. In this exemplary embodiment, the crystal direction of GaN included in the first portion R1 of the pre-light emitting diode layer 100pre may differ from the crystal direction of GaN included in the second portion R2 of the pre-light emitting diode layer 100pre.

The first portion R1 and the second portion R2 of the pre-light emitting diode layer 100pre may include materials having etching selectivity to each other. For example, the first portion R1 of the pre-light emitting diode layer 100pre may be etched and the second portion R2 may not be etched for the same etchant.

Figure 13:
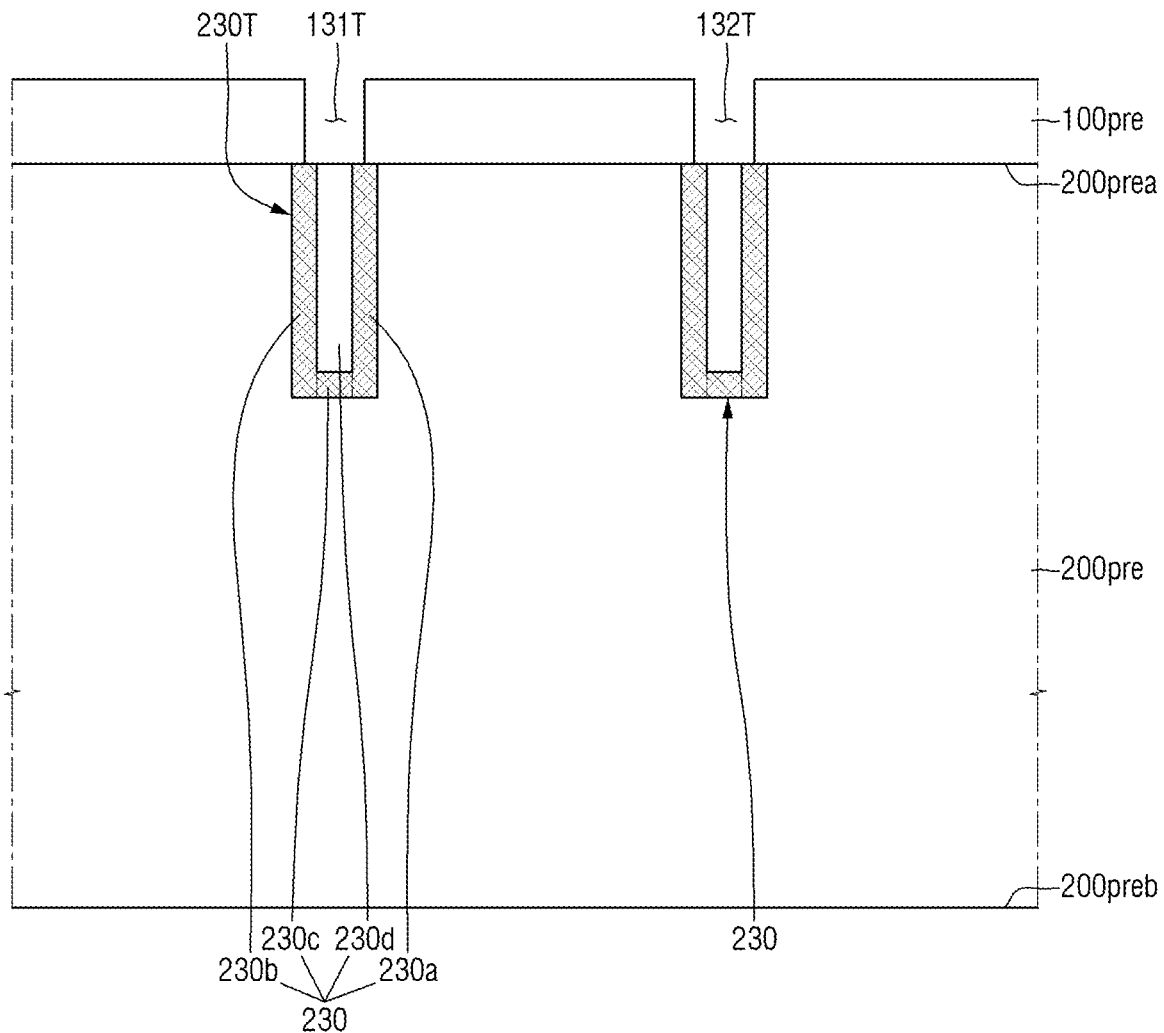

Referring to FIG. 13, first and second separation film trenches 131T and 132T may be formed.

The first and second separation film trenches 131T and 132T may be formed by selectively removing the first portion R1 of the pre-light emitting diode layer 100pre. The first and second separation film trenches 131T and 132T may expose the partition 230.

Figure 14:
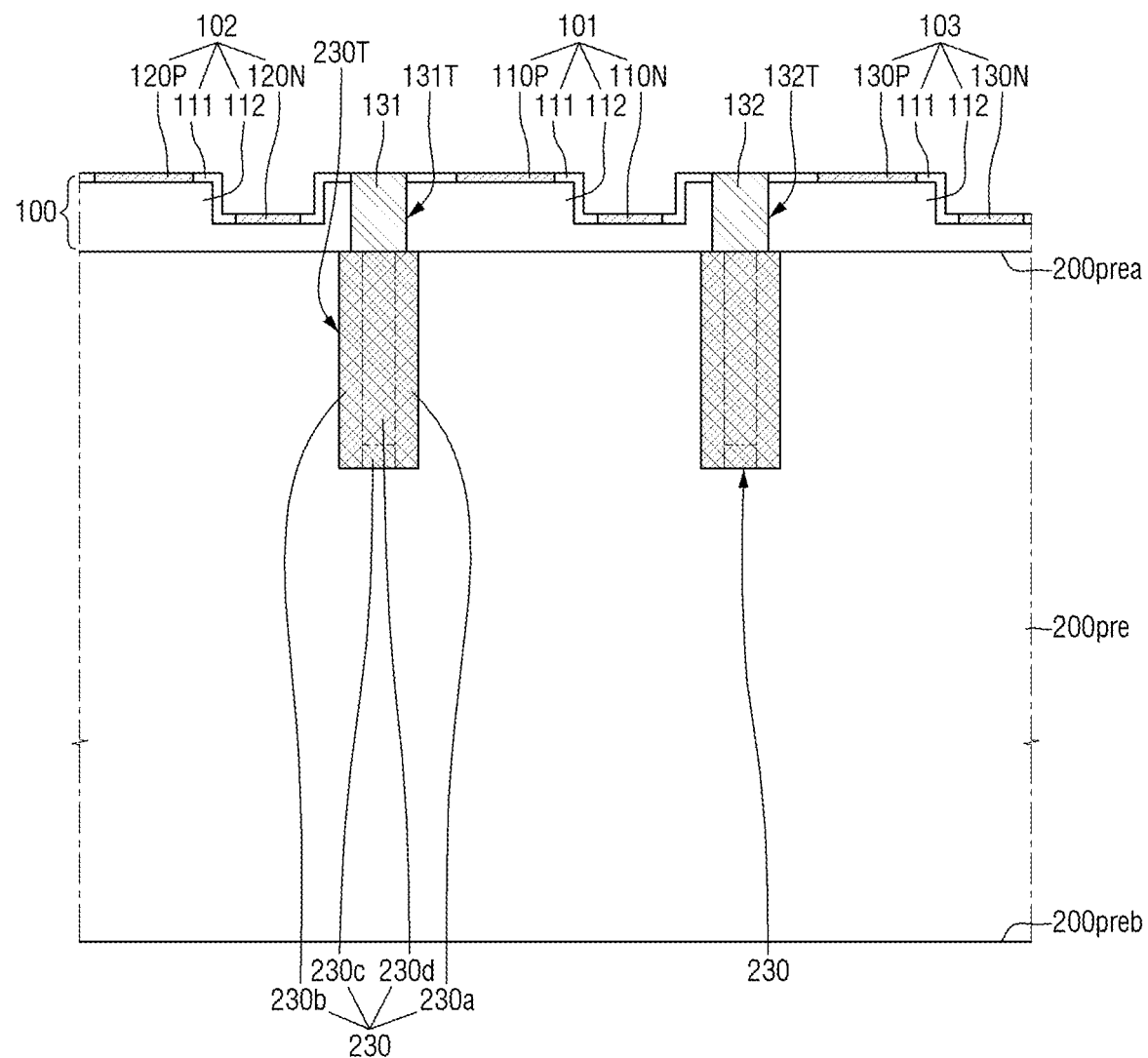

Referring to FIG. 14, a light emitting diode layer 100 may be formed.

Each of the first and second separation films 131 and 132 may be formed by filling each of the first and second separation film trenches 131T and 132T. The first and second separation films 131 and 132 may be formed on the partition 230 so as to be aligned with the partition 230.

In a method for manufacturing a light emitting diode device according to the technical idea of the present inventive concept, after selectively removing the first portion R1 of the pre-light emitting diode layer 100pre to form first and second separation film trenches 131T and 132T, and by filling each of the first and second separation film trenches 131T and 132T to form the first and second separation films 131 and 132, the first and second separation film 131 and 132 and the partition 230 may be aligned. For example, since the first and second separation film trenches 131T and 132T in which the first and second separation films 131 and 132 are formed by selectively removing the portion epitaxially grown on the partition 230 including the partition material, the first and second separation film trenches 131T and 132T may be aligned with the partition 230.

The pre-light emitting diode layer 100pre may be patterned to have, for example, a step. For example, a part of the pre-light emitting diode layer 100pre in which the N electrode is formed may be removed in a subsequent process. The base layer 112 may, for example, be formed by patterning the pre-light emitting diode layer 100pre to have a step.

However, the technical idea of the present inventive concept is not limited thereto. For example, the pre-light emitting diode layer 100pre may, of course, not be patterned to have a step. In this exemplary embodiment, the base layer 112 may be a pre-light emitting diode layer 100pre.

The insulting layer 111 including the P electrodes (for example, the first, second and third P electrodes 110P, 120P, and 130P) and the N electrodes (for example, the first, second and third N electrodes 110N, 120N, and 130N) may be formed on the base layer 112. Therefore, the first, second and third light emitting diode layers 101, 102, and 103 may be formed.

Figure 15:
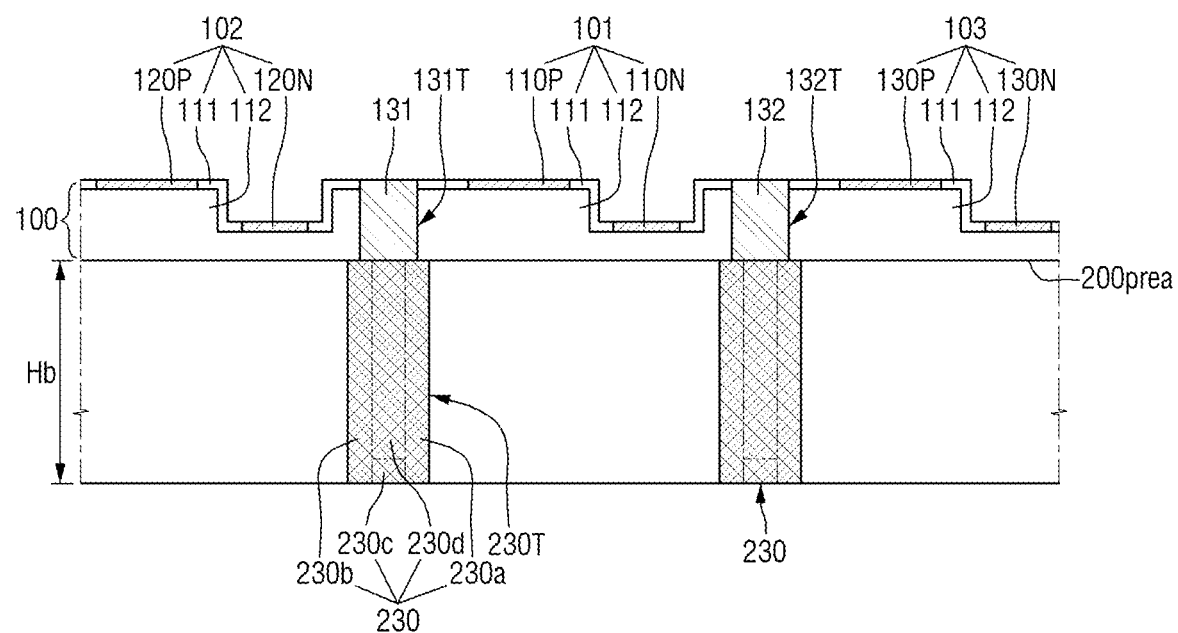

Referring to FIG. 15, a part of the substrate 200pre may be removed to expose the partition 230. The second surface 200preb of the substrate 200pre may be removed to expose the partition 230.

For example, the substrate 200pre may be removed in the direction to the first surface 200prea from the second surface 200preb until the third liner 230c of the partition 230 is exposed. The thickness of the substrate 200pre decreases and may become substantially the same as the height Hb of the partition 230.

In some embodiments, when a part of the substrate 200pre is removed in the direction to the first surface 200prea from the second surface 200preb, the third liner 230c may also be removed to form the gap fill layer 230d. In this exemplary embodiment, a part of the first and second liners 230a and 230b may also be removed.

In the method for manufacturing the light emitting diode device according to some embodiments of the technical idea of the present inventive concept, when removing a part of the substrate 200pre in the direction to the first surface 200prea from the second surface 200preb, the height of the partition 230 may be adjusted.

Figure 16:
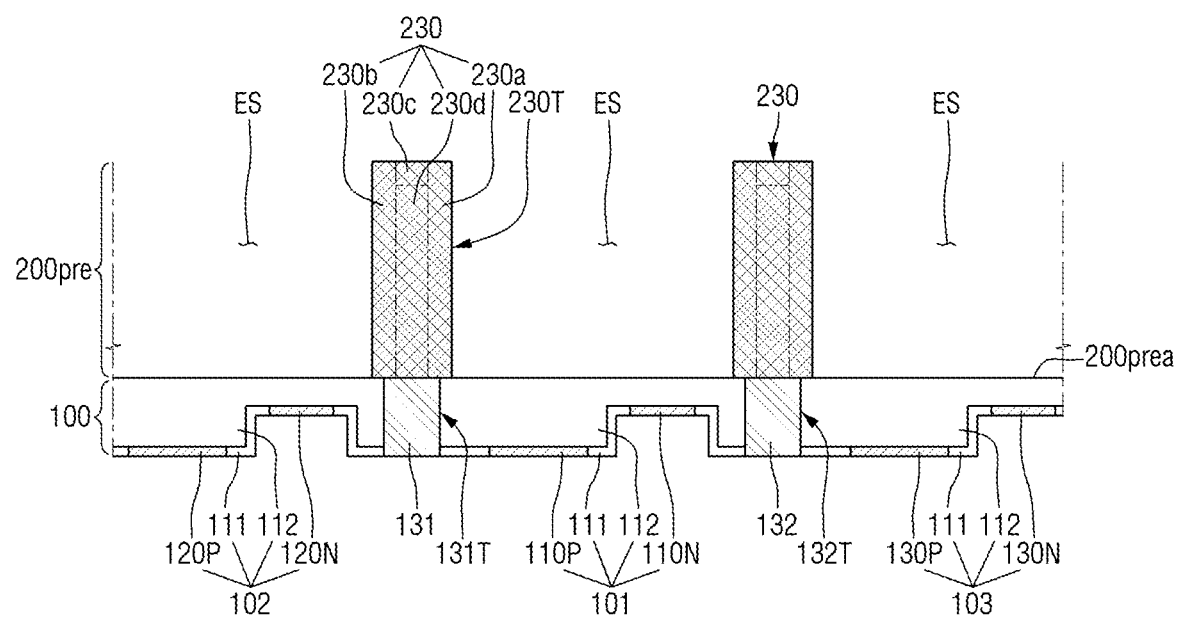

Referring to FIG. 16, the substrate 200pre may be selectively removed to form an empty space ES.

In some embodiments, the structure of FIG. 11 may be upside down before the empty space ES is formed. However, the technical idea of the present inventive concept is not limited thereto. For example, after the empty space ES is formed, the structure of FIG. 11 may, of course, be upside down.

The empty space ES may be formed by selectively removing the substrate 200pre by utilizing the etching selectivity between the substrate 200pre and the material (for example, a partition material) contained in the partition 230. For example, since the partition 230 contains an insulating material different from silicon, the substrate 200pre may be etched and removed and the partition 230 may remain for the same etchant.

The empty space ES may be defined by the partition 230 and the second portion R2 of the light emitting diode layer 100. The empty space ES may be, for example, a space surrounded by the partition 230. The side wall of the empty space ES may be defined by, for example, a partition 230. The bottom surface of the empty space ES may be defined by, for example, the base layer 112.

Figure 17:
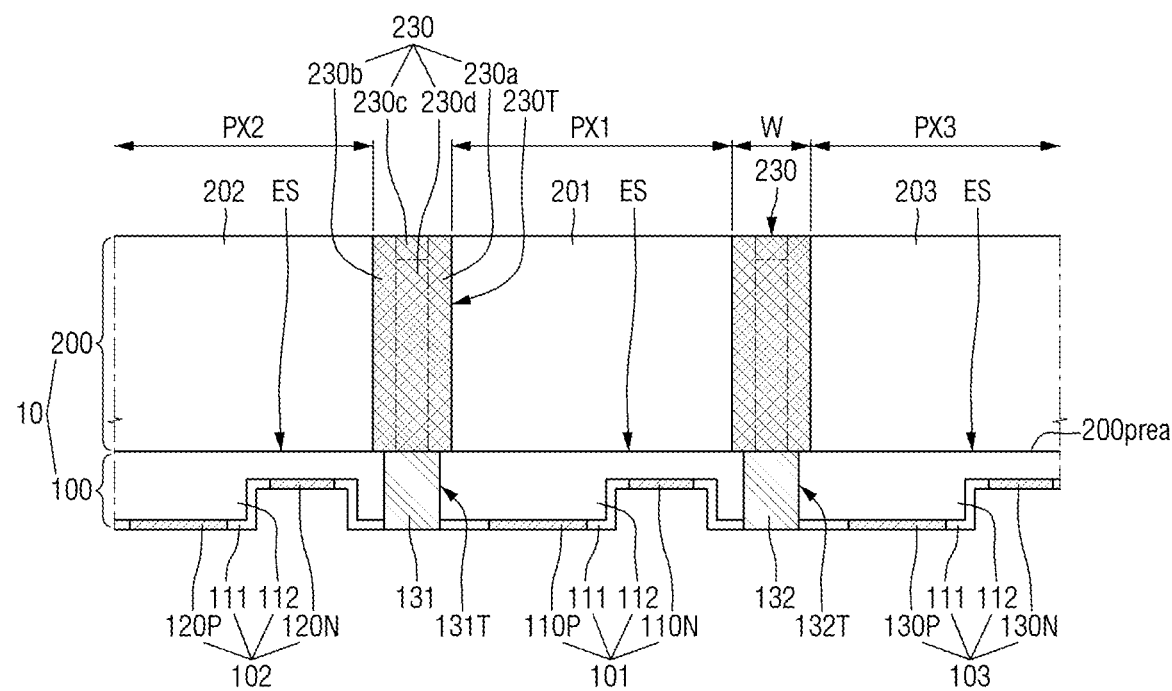

Referring to FIG. 17, the color conversion layer 200 on the light emitting diode layer 100 may be formed.

The empty space ES may be filled with a color conversion material (e.g., first, second and third color conversion material 201, 202, and 203). The color conversion layer 200 may include a partition 230 and a color conversion material (e.g., first, second, and third color conversion materials 201, 202, and 203).

The display board 10 including the light emitting diode layer 100 and the color conversion layer 200 may be electrically connected to the driving circuit board 20 in a later process.

In FIGS. 12 to 17, the partition 230 is illustrated to have the shape of FIG. 11A, but it is not limited thereto. For example, the partition 230 illustrated in FIGS. 12 to 17 may, of course, be replaced with the shape of FIG. 11B.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A light emitting diode display device comprising:
   a first light emitting diode pixel including a first light emitting diode layer and a first color conversion material on the first light emitting diode layer;
   a second light emitting diode pixel including a second light emitting diode layer and a second color conversion material on the second light emitting diode layer;
   a separation film disposed between the first light emitting diode layer and the second light emitting diode layer; and
   a partition disposed between the first color conversion material and the second color conversion material and including a partition material,
   wherein the first and second light emitting diode pixels are divided by the separation film and the partition,
   the partition is disposed on the separation film in alignment with the separation film such that the partition includes linear portions that extend in a first direction and the separation film includes linear portions that also extend in the first direction and vertically overlap the linear portions of the partition, and
   the partition material includes an insulating material different from silicon,
   wherein the partition includes:
   a first liner which contacts the first color conversion material;

a second liner which is spaced from the first liner in a horizontal direction and contacts the second color conversion material;
a third liner which connects an upper part of the first liner and an upper part of the second liner; and
a gap fill layer disposed under the third liner and disposed between the first liner and the second liner.

2. The light emitting diode display device of claim 1, wherein the partition material includes at least one of silicon oxide and silicon nitride.

3. The light emitting diode display device of claim 1, wherein at least a part of the separation film is overlapped by the partition.

4. The light emitting diode display device of claim 1, further comprising:
a display board including a plurality of unit pixels; and
a driving circuit board electrically connected to the display board,
wherein one of the plurality of unit pixels includes at least one of the partition, the first light emitting diode pixel and the second light emitting diode pixel.

5. The light emitting diode display device of claim 1, further comprising:
a driving circuit board electrically connected to the first and second light emitting diode pixels,
wherein the first light emitting diode layer and the second light emitting diode layer are disposed on the driving circuit board.

6. The light emitting diode display device of claim 1, wherein the first liner and the second liner include the partition material.

7. The light emitting diode display device of claim 6, wherein the third liner includes the partition material.

8. The light emitting diode display device of claim 6, wherein the gap fill layer includes one of silicon and a metal material.

9. A light emitting diode display device comprising:
a driving circuit board;
a light emitting diode layer which is disposed on the driving circuit board and includes a first positive electrode and a first negative electrode;
a separation film which is formed in the light emitting diode layer and formed on one side of the first positive electrode and the first negative electrode;
a color conversion layer on the light emitting diode layer; and
a partition which is formed in the color conversion layer and disposed on the separation film in alignment with the separation film such that the partition includes linear portions that extend in a first direction and the separation film includes linear portions that also extend in the first direction and vertically overlap the linear portions of the partition,
wherein the partition includes:
a first liner which contacts a first color conversion material;
a second liner which is spaced from the first liner in a horizontal direction and contacts a second color conversion material;
a third liner which connects an upper part of the first liner and an upper part of the second liner; and
a gap fill layer disposed under the third liner and disposed between the first liner and the second liner.

10. The light emitting diode display device of claim 9, wherein the linear portions of the partition includes first linear portions that extend in the first direction and the linear portions of the separation film includes first linear portions that also extend in the first direction and vertically overlap the first linear portions of the partition, and wherein the linear portions of the partition includes second linear portions that extend in a second direction perpendicular to or crossing the first direction and the linear portions of the separation film further include second linear portions that also extend in the second direction and vertically overlap the second linear portions of the partition.

11. The light emitting diode display device of claim 9, wherein the partition includes an insulating material different from silicon.

12. The light emitting diode display device of claim 11, wherein the partition includes at least one of silicon oxide and silicon nitride.

13. The light emitting diode display device of claim 9, wherein the light emitting diode layer includes a first light emitting diode layer and a second light emitting diode layer separated by the separation film,
the color conversion layer includes the first color conversion material and the second color conversion material separated by the partition,
the first light emitting diode layer includes the first positive electrode and the first negative electrode, and
the first color conversion material is disposed on the first light emitting diode layer.

14. The light emitting diode display device of claim 13, further comprising:
a display board which is electrically connected to the driving circuit board and includes a plurality of unit pixels,
wherein any one of the plurality of unit pixels includes a first light emitting diode pixel and a second light emitting diode pixel,
the first light emitting diode pixel includes the first light emitting diode layer and the first color conversion material,
the second light emitting diode pixel includes the second light emitting diode layer and the second color conversion material, and
the first light emitting diode pixel and the second light emitting diode pixel are separated by the separation film and the partition.

15. A light emitting diode display device comprising:
a light emitting diode layer; and
a color conversion layer which is disposed on the light emitting diode layer and includes a first color conversion material, and a partition surrounding the first color conversion material,
wherein the partition includes
a first liner which is in contact with the first color conversion material and surrounds the first color conversion material,
a second liner spaced apart from the first liner in a horizontal direction,
a third liner which connects an upper part of the first liner and an upper part of the second liner, and
a gap fill layer disposed under the third liner and located between the first and second liners.

16. The light emitting diode display device of claim 15, wherein the first and second liners include an insulating material different from silicon.

17. The light emitting diode display device of claim 15, wherein the light emitting diode layer includes a separation film disposed in the light emitting diode layer, and
the partition is disposed on the separation film in alignment with the separation film such that the partition includes linear portions that extend in a first direction and the separation film includes linear portions that also extend in the first direction and vertically overlap the linear portions of the partition.

18. The light emitting diode display device of claim 17, wherein the light emitting diode layer includes a first light emitting diode layer and a second light emitting diode layer separated by the separation film, the color conversion layer further includes a second color conversion material, the first and second color conversion materials are separated by the partition, and the first color conversion material is disposed on the first light emitting diode layer.

19. The light emitting diode display device of claim 18, further comprising:

a display board including a plurality of unit pixels; and a driving circuit board electrically connected to the display board, wherein any one of the plurality of unit pixels includes a first light emitting diode pixel and a second light emitting diode pixel, the first light emitting diode pixel includes the first light emitting diode layer and the first color conversion material, the second light emitting diode pixel includes the second light emitting diode layer and the second color conversion material, and the first light emitting diode pixel and the second light emitting diode pixel are separated by the separation film and the partition.

* * * * *